United States Patent [19]

Shibata

[11] Patent Number: 5,208,777
[45] Date of Patent: May 4, 1993

[54] SEMICONDUCTOR MEMORY DEVICE
[75] Inventor: Kazuo Shibata, Tokyo, Japan
[73] Assignee: NEC Corporation, Tokyo, Japan
[21] Appl. No.: 801,375
[22] Filed: Dec. 2, 1991
[30] Foreign Application Priority Data
  Nov. 30, 1990 [JP] Japan .................. 2-340104
[51] Int. Cl.[5] ............................................ G11C 29/00
[52] U.S. Cl. ..................................... 365/201; 365/149; 371/21.1
[58] Field of Search ................. 365/201, 149; 371/21.1

[56] References Cited

U.S. PATENT DOCUMENTS

| | | | |
|---|---|---|---|
| 4,873,669 | 10/1989 | Furutani et al. ................ | 365/201 X |
| 5,079,743 | 1/1992 | Suwa et al. ......................... | 365/149 |
| 5,109,382 | 4/1992 | Fukunawa ....................... | 365/201 X |
| 5,117,393 | 5/1992 | Miyazawa et al. ................. | 365/201 |
| 5,134,587 | 7/1992 | Steele .................................. | 365/201 |

FOREIGN PATENT DOCUMENTS

| | | | |
|---|---|---|---|
| 0145431 | 12/1978 | Japan ................................... | 371/21.1 |
| 0022300 | 1/1991 | Japan ................................... | 371/21.1 |

Primary Examiner—Eugene R. LaRoche
Assistant Examiner—Son Dinh
Attorney, Agent, or Firm—Sughrue, Mion, Zinn, Macpeak & Seas

[57] ABSTRACT

A circuit for carrying out ordinary "write" and "read" operation during operation of applying a test voltage to a cell opposite electrode in test operation is provided. The circuit converts a test mode instruction signal to an ordinary operation instruction signal in a semiconductor memory device. The test mode instruction signal can be applied to an input pin of the semiconductor memory device, so that the test operation can be carried out even after the assembly of the semiconductor memory device.

4 Claims, 5 Drawing Sheets

SEMICONDUCTOR MEMORY DEVICE

FIELD OF THE INVENTION

This invention relates to a semiconductor memory device, and more particularly to, a dynamic type random access memory having a circuit for controlling a test voltage applied to a cell opposite electrode.

BACKGROUND OF THE INVENTION

In the test of a semiconductor memory device, one of voltages Vcc (power supply voltage), ½ Vcc and 0 (ground) is applied to an opposite electrode of a memory cell, so that the short-circuit of the memory cell, the current leakage to a semiconductor substrate, etc. are examined.

One of test voltage applying circuits comprises an intermediate voltage generating circuit for generating the voltage of ½ Vcc, a first NMOS transistor positioned between the intermediate voltage generating circuit and a cell opposite electrode, a PMOS transistor positioned between a power supply of the voltage Vcc and the cell opposite electrode, and a second NMOS transistor positioned between the cell opposite electrode and ground.

In operation of the test, the ½ Vcc voltage is applied to the cell opposite electrode at a state of the turning-off of the first and second NMOS transistor and the PMOS transistor, and the Vcc and 0 (ground) voltages are applied to the cell opposite electrode separately at states of the turning-off of the first and second NMOS transistors and the turning-on of the PMOS transistor, and of the turning-off of the first NMOS transistor and the PMOS transistor and the turning-on of the second NMOS transistor.

In this test, the respective voltages are applied to pads provided on a chip to be connected to the cell opposite electrode. For this structure, the test can be carried out only before assembling the chip as a semiconductor device.

A test voltage applying circuit, in which the test can be carried out even after the assembly of a semiconductor memory device, comprises a high voltage decision circuit connected to an input pin which is connected to an internal circuit of the memory device, a NOR circuit having first and second inputs connected to first and second outputs of the high voltage decision circuit, a first PMOS transistor connected at a gate to the first output of the high voltage decision circuit, and at a source to a power supply of Vcc, a second PMOs transistor connected at a gate to an output of the NOR circuit, and at a source to the first PMOS transistor, an intermediate voltage generating circuit for generating a ½ Vcc voltage, a first NMOS transistor connected at a gate to the output of the NOR circuit, at a source-drain path to a drain of the second PMOS transistor and ground, and a second NMOS transistor connected at a gate to the first output of the high voltage decision circuit, and at a source-drain path to the intermediate voltage generating circuit, a cell opposite electrode, and a nodal point between the second PMOs transistor and the first NMOS transistor.

In operation of the test, an increasing voltage is applied through the input pin to the high voltage decision circuit. In this situation, when the increasing voltage ranges between the power supply voltage Vcc and a first predetermined voltage $V_1$ ($>$Vcc), high logic signals are generated at the first and second outputs of the high voltage decision circuit, so that the second NMOs transistor is turned on to apply the ½ Vcc voltage from the intermediate voltage generating circuit to the cell opposite electrode, while the first PMOs and NMOS transistors are turned off. When the increasing voltage becomes a level between the first predetermined voltage $V_1$ and a second predetermined voltage $V_2$ ($>V_1$), the first and second outputs of the high voltage decision circuit become low and high, respectively, so that the first and second PMOS transistors are turned on to apply the power supply voltage Vcc to the cell opposite electrode, while the first and second NMOS transistors are turned off. Further, when the increasing voltage becomes the second predetermined voltage $V_2$, both the first and second outputs of the high voltage decision circuit become low, so that the first NMOS transistor is turned on to apply 0 (ground) voltage to the cell opposite electrode, while the second PMOS and NMOS transistors are turned off (although the first PMOS is turned on). Thus, the test can be carried out to apply the voltages Vcc, ½ Vcc and 0 to the cell opposite electrode, respectively, even after the assembly of a semiconductor memory device.

This test circuit, however, has a disadvantage in that the semiconductor memory device can not operate, because a voltage greater than a power supply voltage is applied to one of input pins.

SUMMARY OF THE INVENTION

Accordingly, it is an object of the invention to provide a semiconductor memory device in which a test of memory cells can be carried out even after the assembly thereof.

It is a further object of the invention to provide a semiconductor memory device which can operate during a test of memory cells.

According to the invention, a semiconductor memory device, comprises:

capacitive memory cells each having first and second electrodes for sandwiching a dielectric member therebetween, the first electrode accumulating a bit of stored information, and the second electrode being fixed by a predetermined voltage in ordinary "write" and "read" operation;

a voltage applying circuit for applying a voltage selected from a power supply voltage of "Vcc", an intermediate voltage of "½ Vcc" and a voltage of ground level to the second electrode in test operation by receiving a test mode instruction signal; and an operation carrying-out circuit for carrying out the ordinary "write" and "read" operation during the test operation, the operation carrying-out circuit converting the test mode instruction signal to an instruction signal of the ordinary "write" and "read" operation.

BRIEF DESCRIPTION OF THE DRAWINGS

The invention will be explained in more detail in conjunction with appended drawings, wherein.

DESCRIPTION OF THE PREFERRED EMBODIMENTS

Before describing a semiconductor memory device of a preferred embodiment according to the invention, the aforementioned former and latter conventional test voltage applying circuit will be explained.

Figure 1:
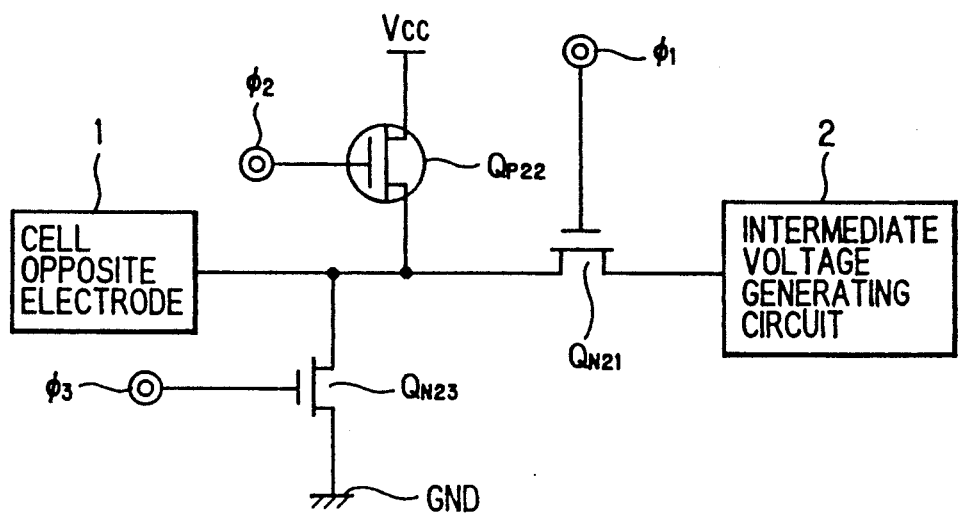
FIG. 1 is a circuit diagram showing a conventional test voltage applying circuit for a semiconductor memory device.

FIG. 1 shows the former conventional test voltage applying circuit which comprises an intermediate voltage generating circuit 2 for generating an intermediate voltage of ½ Vcc to be applied to a cell opposite electrode 1, a first NMOS transistor $Q_{N21}$ connected at a gate to a first signal input terminal (pad) $\phi_1$ and at a source-drain path to the cell opposite electrode 1 and the intermediate voltage generating circuit 2, a PMOS transistor $Q_{P22}$ connected at a gate to a second signal input terminal (pad) $\phi_2$ and at a source-drain path to a power supply of Vcc and the cell opposite electrode 1, and a second NMOS transistor $Q_{N23}$ connected at a gate to a third signal input terminal (pad) $\phi_3$ and at a source-drain path to the cell opposite electrode and ground.

Operation of the test is summarized as set out below.

| INPUT SIGNAL | TRANSISTOR | VOLTAGE APPLIED TO CELL ELECTRODE |
|---|---|---|
| $\phi_1 = 1$ | $Q_{N21}$ = ON | ½ Vcc |
| $\phi_2 = 1$ | $Q_{P22}$ = OFF | |
| $\phi_3 = 0$ | $Q_{N23}$ = OFF | |
| $\phi_1 = 0$ | $Q_{N21}$ = OFF | Vcc |
| $\phi_2 = 0$ | $Q_{P22}$ = ON | |
| $\phi_3 = 0$ | $Q_{N23}$ = OFF | |
| $\phi_1 = 0$ | $Q_{N21}$ = OFF | GROUND |
| $\phi_2 = 1$ | $Q_{P22}$ = OFF | |
| $\phi_3 = 1$ | $Q_{N23}$ = ON | |

Figure 2A:
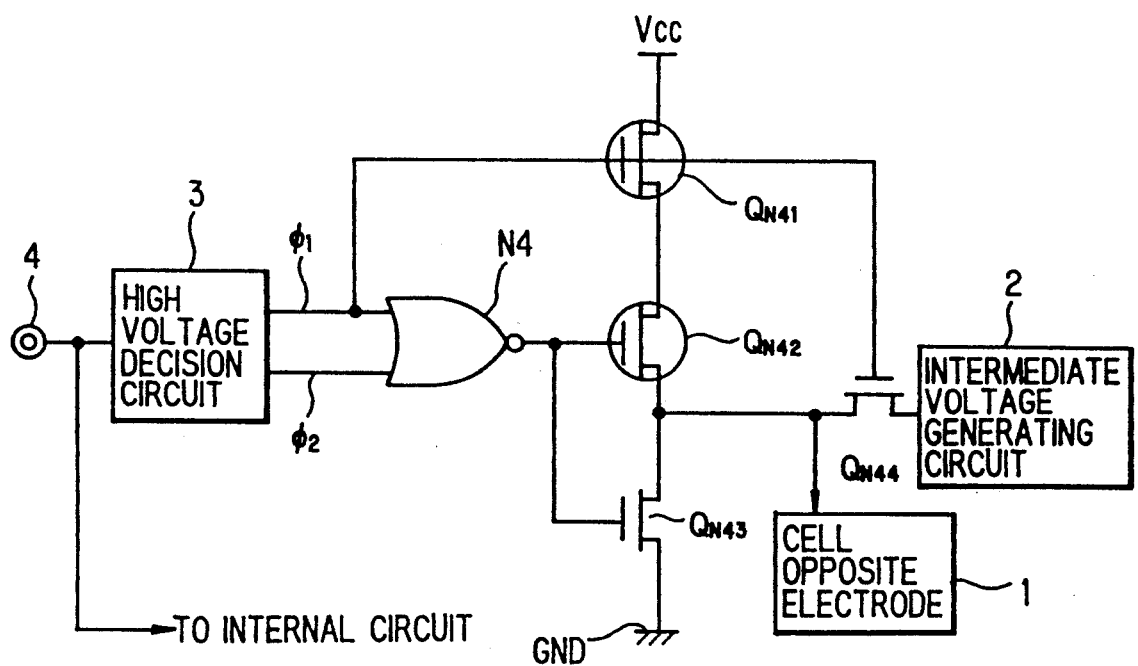
FIG. 2A is a circuit diagram showing another conventional test voltage applying circuit for a semiconductor device.
Figure 3:
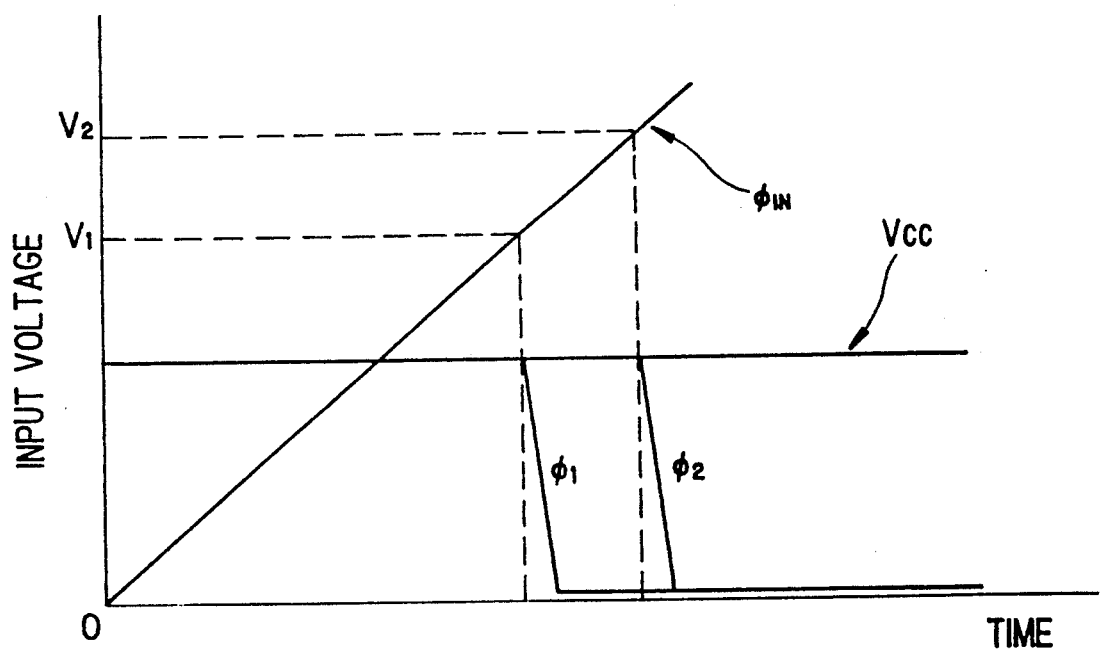
FIG. 3 is a timing chart showing a relation between the increase of a voltage applied to an input pin of the semiconductor memory device and output signals of the high voltage decision circuit of FIG. 2B.

FIG. 2A shows the latter conventional test voltage applying circuit which comprises an intermediate voltage generating circuit for generating an intermediate voltage of ½ Vcc to be applied to a cell opposite electrode 1, a high voltage decision circuit 3 for generating first and second output signals $\phi_1$ and $\phi_2$ of levels, as shown in FIG. 3, dependent on a level of a voltage applied to an input pin 4 of a semiconductor memory device, a NOR circuit N4 having first and second inputs supplied with the first and second output signals $\phi_1$ and $\phi_2$ of the high voltage decision circuit 3, a first PMOS transistor $Q_{P41}$ connected at a gate to the high voltage decision circuit 3 to receive the first output signal $\phi_1$ therefrom and at a source to a power supply of Vcc, a second PMOS transistor $Q_{P41}$, a first NMOS transistor $Q_{N43}$ connected at a gate to the output of the NOR circuit N4 and at a source-drain path to a drain of the second PMOS transistor $Q_{N42}$ and ground, and a second NMOS transistor $Q_{N44}$ connected at a gate to the high voltage decision circuit 3 to receive the first output signal $\phi_1$ therefrom and at a source-drain path to the intermediate voltage generating circuit 2 and a nodal point between the second PMOS transistor $Q_{P42}$ and the first NMOS transistor $Q_{N43}$.

Figure 2B:
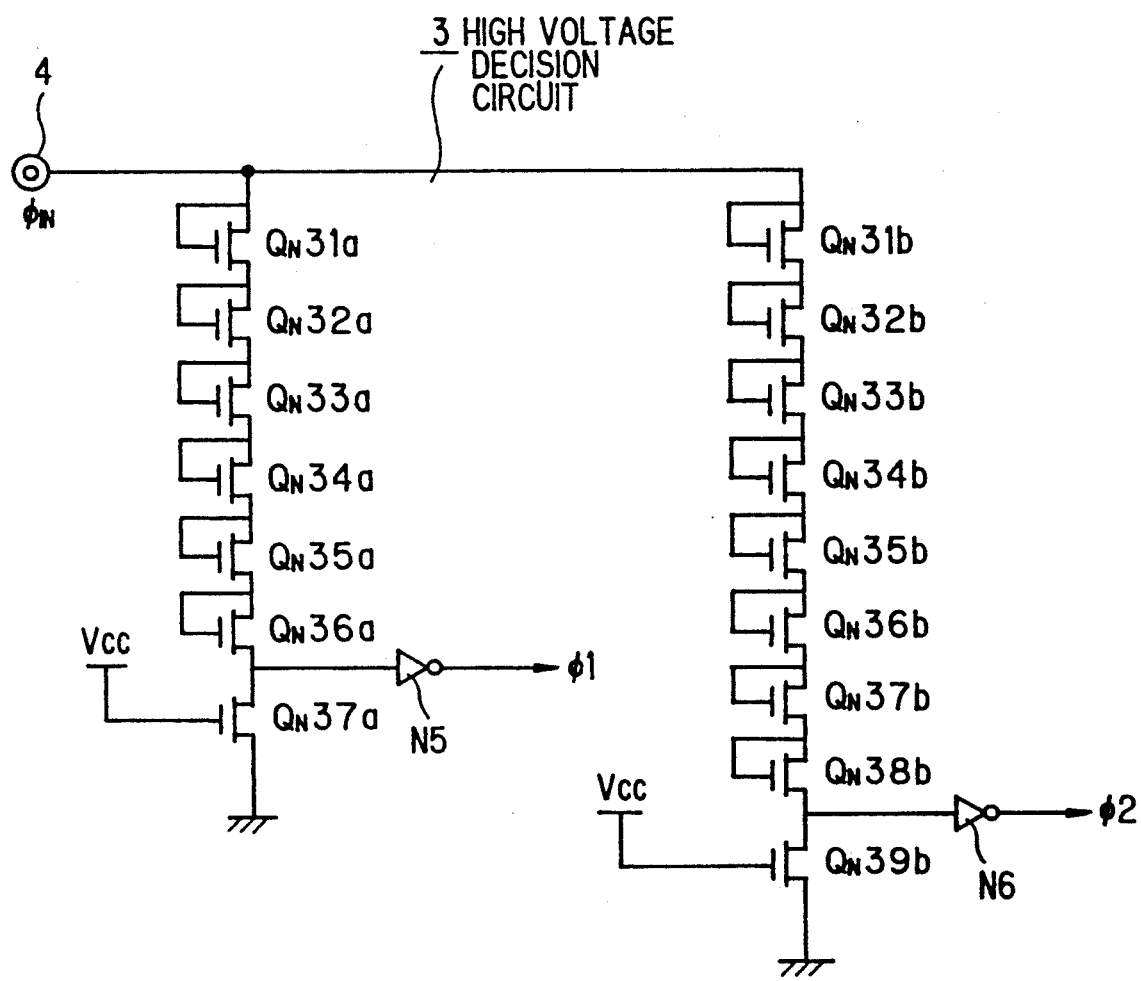
FIG. 2B is a circuit diagram showing a high voltage decision circuit used in the test voltage applying circuit of FIG. 2A.

FIG. 2B shows the high voltage decision circuit 3 which comprises NMOS transistors 31a to 36a connected in serial by source-drain paths and at gates to sources, an NMOS transistor 37a connected at a gate to a power supply of Vcc and at a source-drain path to the NMOS transistor 36a and ground, an inverter N5 connected at an input to a nodal point between the NMOS transistors 36a and 37a, NMOS transistors 31b to 38b connected in serial by source-drain paths and at gates to sources, an NMOS transistor 39b connected at a gate to the power supply of Vcc and at a source-drain path to the NMOS transistor 38b and ground, and an inverter connected at an input to a nodal point between the NMOS transistors 38b and 39b, wherein the output signals $\phi_1$ and $\phi_2$ are supplied from the inverters N5 and N6.

FIG. 3 shows the change of the output signals $\phi_1$ and $\phi_2$ relative to an input voltage applied to the input pin 4. As apparent from the circuit structure of FIG. 2B, the output signal $\phi_1$ changes from "high" to "low", when the input voltage becomes a first predetermined voltage $V_1$ (>Vcc), and the output signal $\phi_2$ changes from "high" to "low", when the input voltage becomes a second predetermined voltage $V_2$ (>$V_1$).

Operation of the test is summarized as set out below.

| INPUT VOLTAGE | OUTPUT SIGNAL | TRANSISTOR | VOLTAGE APPLIED TO CELL ELECTRODE |
|---|---|---|---|
| V < V1 | $\phi_1 = 1$ | $Q_{P41}$ = OFF | ½ Vcc |
| | $\phi_2 = 1$ | $Q_{P42}$ = ON | |
| | | $Q_{N43}$ = OFF | |
| | | $Q_{N44}$ = ON | |
| V1 ≤ V < V2 | $\phi_1 = 0$ | $Q_{P41}$ = ON | Vcc |
| | $\phi_2 = 1$ | $Q_{P42}$ = ON | |
| | | $Q_{N43}$ = OFF | |
| | | $Q_{N44}$ = OFF | |
| V ≥ V2 | $\phi_1 = 0$ | $Q_{P41}$ = ON | GROUND |
| | $\phi_2 = 0$ | $Q_{P42}$ = OFF | |
| | | $Q_{N43}$ = ON | |
| | | $Q_{N44}$ = OFF | |

Next, a semiconductor memory device of a first preferred embodiment according to the invention will be explained in FIG. 4.

The semiconductor memory device comprises an intermediate voltage generating circuit 2, a test voltage applying circuit 13, an operation carrying-out circuit 14, and an internal circuit 15 including cell opposite electrodes 1, wherein like parts of the test voltage applying circuit 13 are indicated by like reference numerals as used in FIG. 2A, and the operation carrying-out circuit 14 comprises a NAND circuit N2 having a first input connected to an output of the first output signal $\phi_1$ and a second input connected to an output enable pin $\overline{OE}$, and an inverter N3 having an input connected to an output of the NAND circuit N2 and an output connected to the internal circuit 15.

In this first preferred embodiment, the semiconductor memory device is assumed to be a dynamic type random access memory (defined "DRAM" hereinafter) having a capacity of 1M (=256K×4) bits, and an input pin applied with a control voltage greater than a power supply voltage Vcc is assumed to be the output enable pin $\overline{OE}$, as described above, to which a low level signal is applied to allow the output of data stored therein in an ordinary operation.

In operation of the test, the control voltage $\phi_{IN}$ greater than the power supply voltage Vcc is applied to the pin $\overline{OE}$, so that the first output signal $\phi_1$ changes from "high" to "low" in the high voltage decision circuit 3, and the second output signal $\phi_2$ changes from "high" to "low" with a predetermined delay time proportional to the difference of number between two groups of serially connected NMOS transistors in the structure of FIG. 2B. In this manner, the voltages of ½ Vcc, Vcc and 0 (ground) are, respectively, applied to the cell opposite electrode 1, as explained before. At the same time, the first output signal $\phi_1$ of "low" is applied to the NAND circuit N2 together with the control signal $\phi_{IN}$ applied from the pin $\overline{OE}$, so that an output signal $\phi_3$ of "high" is supplied from the NAND circuit N2 to the inverter N3. As a result, an output signal $\phi_4$ of "low" is supplied as an $\overline{OE}$ signal to the internal circuit 15, so that a data output circuit (not shown) is enabled to read data from the memory cells. Otherwise, operation of writing data into the memory cells can be realized by the control of E.W (Early Write).

Figure 5:
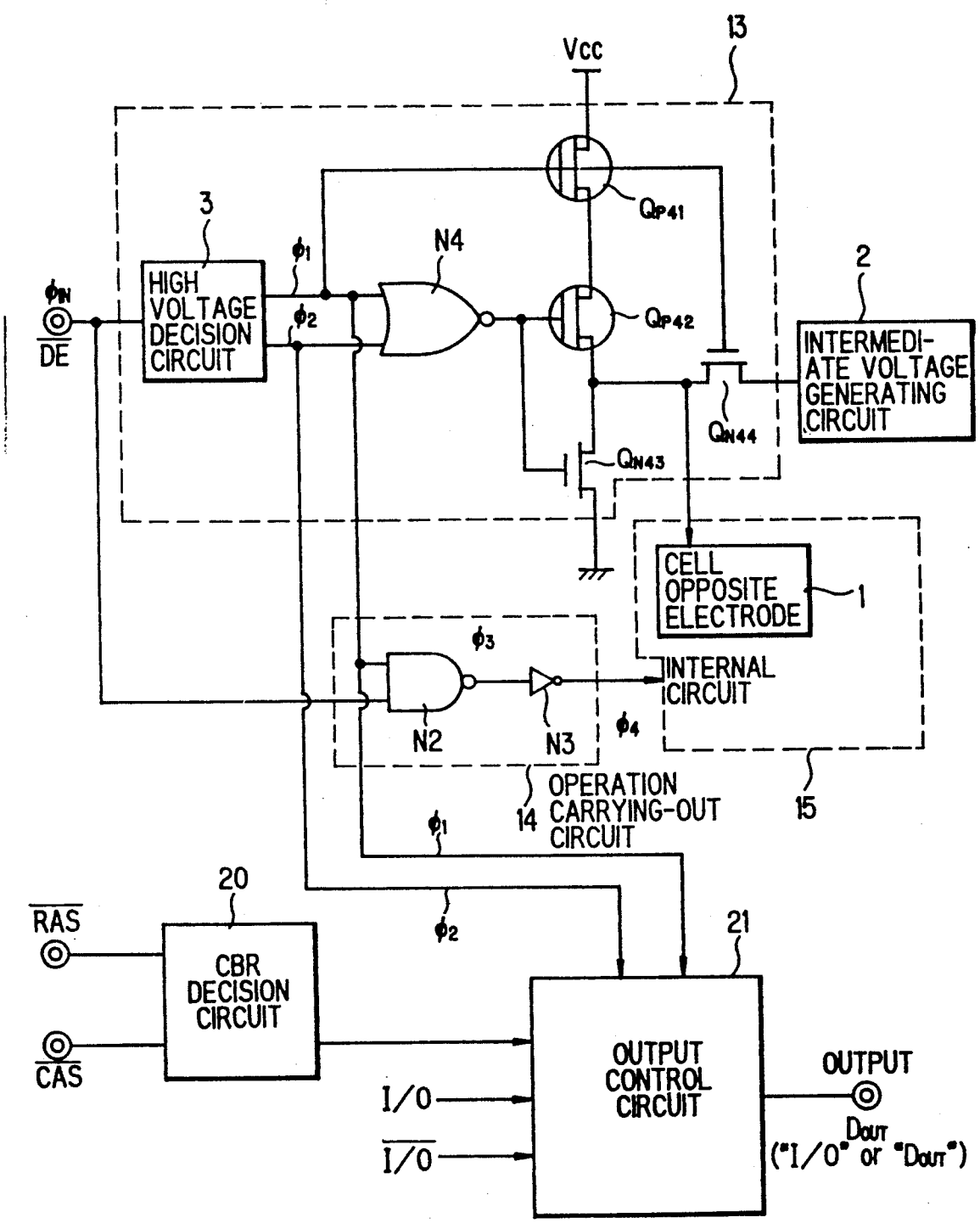

A semiconductor memory device of a second preferred embodiment according to the invention will be explained in FIG. 5.

Figure 4:
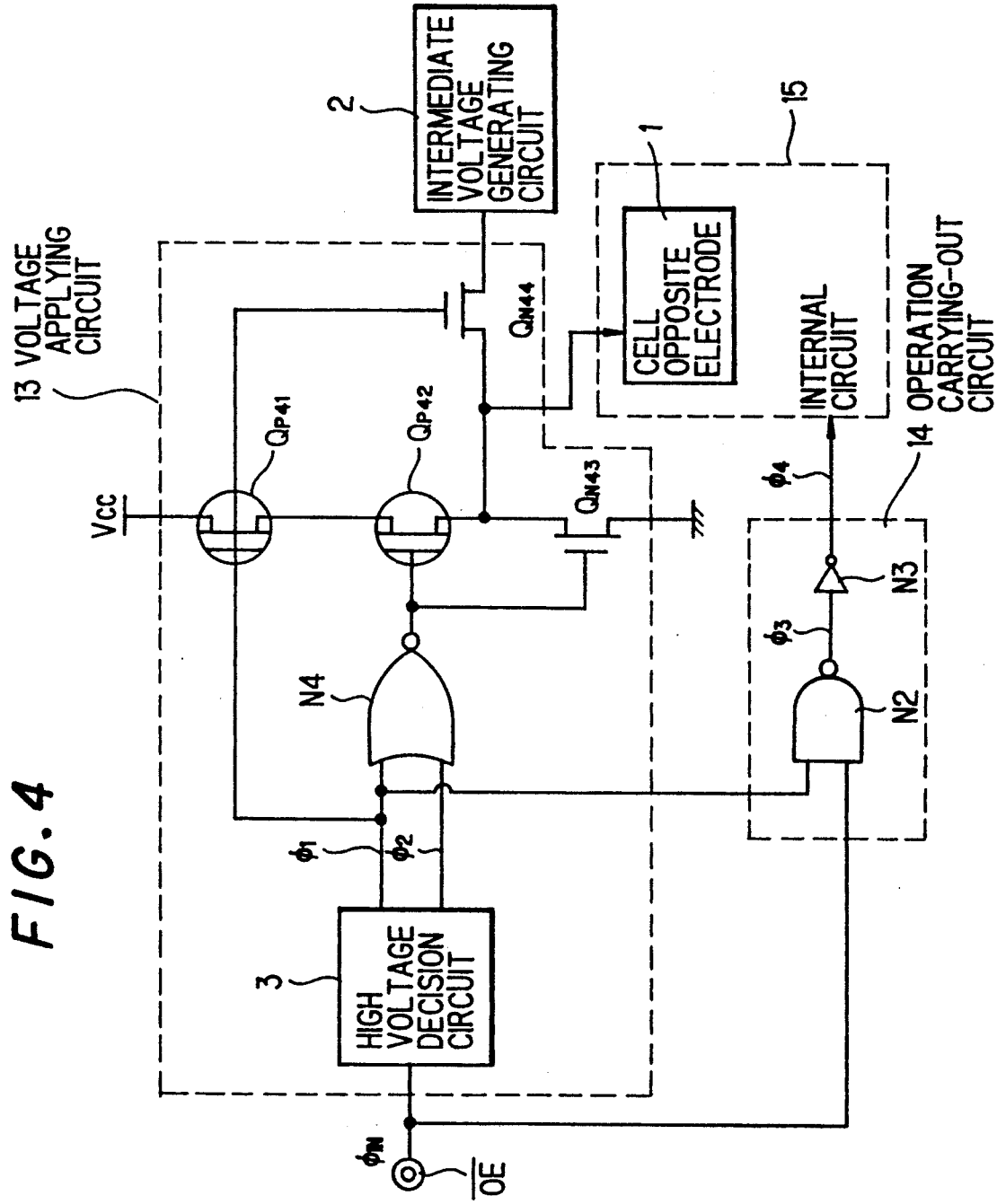
FIGS. 4 and 5 are circuit diagrams showing semiconductor memory devices of first and second preferred embodiments according to the invention.

The semiconductor memory device comprises an intermediate voltage generating circuit 2 for generating an intermediate voltage of ½ Vcc to be applied to an cell opposite electrode 1, a test voltage applying circuit 13, an operation carrying-out circuit 14, an internal circuit 15 including memory cells, a CBR decision circuit 20, and an output control circuit 21, wherein the test voltage applying circuit 13, the operation carrying-out circuit 14, and the internal circuit 15 are of the same structures as those in FIG. 4, in which like parts are indicated by like reference numerals.

In this second preferred embodiment, when a test mode is carried-out in CBR ($\overline{CAS}$-Before-$\overline{RAS}$) operation, output operation is controlled by the output control circuit 21 supplied with the first and second output signals $\phi_1$ and $\phi_2$ of the high voltage decision circuit 3. The CBR operation is decided by the CBR decision circuit 20 having inputs $\overline{RAS}$ and $\overline{CAS}$. In this output control, when the first output signal $\phi_1$ is only of a low level, so that a test voltage of Vcc is applied to the cell opposite electrode 1, an output signal of "high" is obtained at an output Dout of the output control circuit 21, and when the first and second output signals $\phi_1$ and $\phi_2$ are of a low level, so that the ground level is applied to the cell opposite electrode 1, an output signal of "low" is obtained at the output Dout of the output control circuit 21. On the other hand, an output signal of "high" or "low" is obtained dependent on a content of an accessed memory cell in ordinary operation at the output Dout of the output control circuit 21.

As described above, a voltage applied to the cell opposite electrode 1 is changed to be levels of "Vcc", "½ Vcc" and "ground" even after the assembly of the semiconductor memory device by applying a voltage greater than the power supply voltage Vcc to a selected input pin thereof, and the test voltage applied states are respectively checked. In this situation, ordinary operation of Write (E.W) and Read can be carried out.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A semiconductor memory device, comprising:
    capacitive memory cells each having first and second electrodes for sandwiching a dielectric member therebetween, said first electrode accumulating a bit of stored information, and said second electrode being fixed by a predetermined voltage in ordinary "write" and "read" operation;
    a voltage applying circuit for applying a volt selected from a power supply voltage of "Vcc", an intermediate voltage of "½ Vcc" and a voltage of ground level to said second electrode in test operation by receiving a test mode instruction signal; and
    an operation carrying-out circuit for carrying out said ordinary "write" and "read" operation during said test operation, said operation carrying-out circuit converting said test mode instruction signal to an instruction signal of said ordinary "write" and "read" operation.

2. A semiconductor memory device, according to claim 1, wherein:
    said voltage applying circuit comprises a high voltage decision circuit for detecting a changing level of said test mode instruction signal, one of said power supply voltage of "Vcc", said intermediate voltage of "½ Vcc", and said voltage of ground level being selected dependent on said changing level.

3. A semiconductor memory device, according to claim 1, wherein:
    said test mode signal is of a voltage greater than said power supply voltage of "Vcc", and is applied to an input pin selected from external signal input pins of said semiconductor memory device, said external signal input pins being applied with one of said power supply voltage of "Vcc" and said voltage of ground level.

4. A semiconductor memory device, according to claim 1, further comprising:
    a CBR decision circuit for deciding whether CBR ($\overline{CAS}$-Before-$\overline{RAS}$) operation is carried out or not; and
    an output control circuit for controlling an output signal to be high or low dependent on a level of said test mode instruction signal by receiving a decision signal supplied from said CBR decision circuit.

* * * * *